United States Patent
Huang et al.

(10) Patent No.: US 12,315,790 B2
(45) Date of Patent: May 27, 2025

(54) COMPACT ROUTING PACKAGE FOR HIGH FREQUENCY ISOLATION

(71) Applicant: Cypress Semiconductor Corporation, San Jose, CA (US)

(72) Inventors: Chenxi Huang, San Jose, CA (US); Yung Chen, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 18/596,303

(22) Filed: Mar. 5, 2024

(65) Prior Publication Data

US 2024/0290709 A1 Aug. 29, 2024

Related U.S. Application Data

(62) Division of application No. 17/383,918, filed on Jul. 23, 2021, now Pat. No. 11,955,418.

(51) Int. Cl.
*H01L 23/49* (2006.01)
*H01L 23/00* (2006.01)
*H01L 23/498* (2006.01)
*H01L 23/52* (2006.01)

(52) U.S. Cl.
CPC ........ *H01L 23/49838* (2013.01); *H01L 24/14* (2013.01); *H01L 2224/14131* (2013.01); *H01L 2224/14515* (2013.01)

(58) Field of Classification Search
CPC ............... H01L 23/49816; H01L 24/14; H01L 2224/14515; H01L 23/49838; H05K 1/0259; H05K 1/0216; H05K 2201/09227; H05K 3/3436; H05K 2201/10734
USPC ........................................................ 257/738
See application file for complete search history.

(56) References Cited

U.S. PATENT DOCUMENTS

| | | | | |
|---|---|---|---|---|
| 2003/0206405 | A1* | 11/2003 | Zu | H01L 23/49833 361/792 |
| 2012/0293972 | A1* | 11/2012 | Pan | H02M 3/003 361/772 |
| 2017/0229407 | A1* | 8/2017 | Zu | H01L 23/50 |
| 2019/0259695 | A1* | 8/2019 | Gandhi | H01L 25/0652 |
| 2021/0305154 | A1* | 9/2021 | Wang | H01L 28/10 |
| 2022/0071022 | A1* | 3/2022 | Kong | H05K 1/183 |

* cited by examiner

*Primary Examiner* — Didarul A Mazumder

(57) ABSTRACT

Systems, methods, and devices for a ball grid array with non-linear conductive routing are described herein. Systems include a printed circuit board, a microprocessor, a ball grid array, and a substrate. The ball grid array includes a first solder ball and a second solder ball. The substrate includes a non-linear conductive routing electrically coupling the first solder ball and the second solder ball. The non-linear conductive routing includes a first routing section connected to the first solder ball, and a second routing section connected to the second solder ball. The non-linear conductive routing further includes a third routing section connected to the first routing section, and a fourth routing section connected to the third routing section, wherein each of the third routing section and the fourth routing section are rotational routing sections configured to flow current in a first rotational direction.

20 Claims, 13 Drawing Sheets

PRIOR ART

COMPACT ROUTING PACKAGE FOR HIGH FREQUENCY ISOLATION

RELATED APPLICATIONS

This application is a Divisional of U.S. Non-Provisional application Ser. No. 17/383,918, filed Jul. 23, 2021, now U.S. Pat. No. 11,955,418 issued on Apr. 9, 2024, which is incorporated by reference herein in its entirety.

TECHNICAL FIELD

This disclosure generally relates to package ball routing and, more specifically, to a high isolation package ball to ball routing scheme.

BACKGROUND

Because of electrostatic discharge (ESD) requirements, certain ground balls of a ball grid array (e.g., for a surface-mount package used for integrated circuits) need to be connected. The coupling of the ground balls results in low ball to ball isolation at certain frequencies, at least. This results in signal coupling between the ground balls. The coupling between the ground balls (e.g., between VSS and VSS balls) results in inferior signal performance that could degrade various aspects of circuit performance (e.g., power amplifier stability).

DETAILED DESCRIPTION

Figure 1:
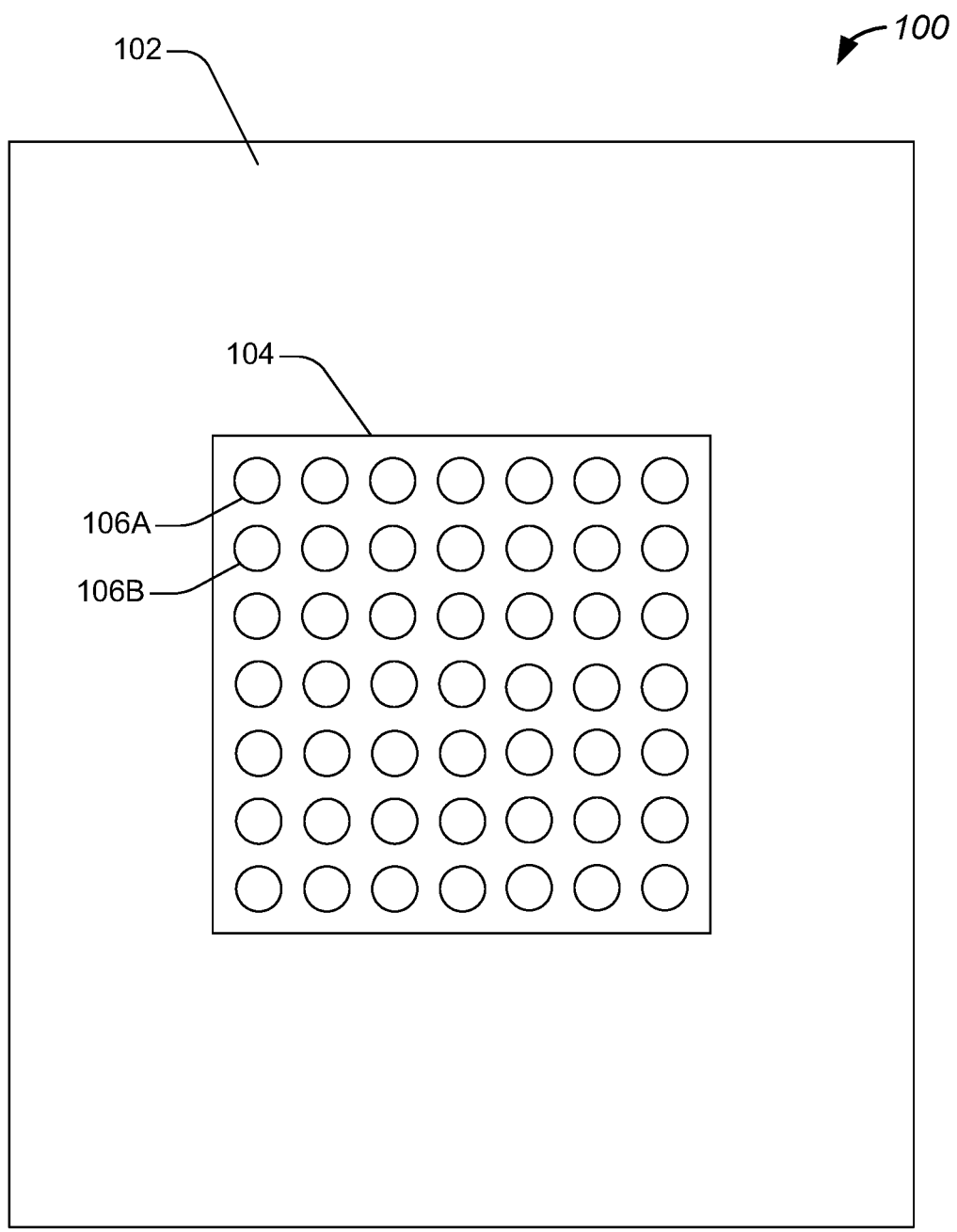
FIG. 1 illustrates a top view of an example of a ball grid array, configured in accordance with some embodiments.

In the following description, numerous specific details are set forth in order to provide a thorough understanding of the presented concepts. The presented concepts may be practiced without some or all of these specific details. In other instances, well known process operations have not been described in detail so as not to unnecessarily obscure the described concepts. While some concepts will be described in conjunction with the specific examples, it will be understood that these examples are not intended to be limiting.

In various situations, certain ground balls of a ball grid array (e.g., a ball grid array for a surface-mount package, such as for integrated circuits) are electrically coupled (e.g., an electrically conductive element connects the two ground balls). However, such coupling of ground balls results in low ball to ball isolation at certain frequencies, resulting in signal coupling and poor isolation between the interconnected ground balls. Such poor isolation results in inferior signal performance that could degrade various aspects of circuit performance.

As will be discussed in greater detail below, ground balls may be connected via non-linear conductive routing. Non-linear conductive routing may include routing that includes a plurality of changes of direction and/or sections. In certain embodiments, the non-linear conductive routing may include at least five distinctive sections, where each section is disposed at an angle to at least one adjacent section. The non-linear conductive routing may increase the effective distance between two connected ground balls or other surface-mount packaging and, accordingly, increase isolation in at least one frequency band between the two connected ground balls or other surface-mount packaging. Such a frequency band may be any appropriate frequency band, such as any appropriate narrow or wide bands, and may include, for example, a frequency band between 100 megahertz (MHz) to 10 gigahertz (GHz), 2 GHz to 4 GHz, 2.3 GHz to 2.7 GHZ, 2.4 GHz to 2.5 GHz, and/or another such frequency band. Accordingly, though two solder balls may be separated by a first linear distance, the non-linear conductive routing may be a total length greater than that first linear distance, increasing the effective distance between the two solder balls. It is appreciated that, while reference is generally made herein to ground balls as an electrical interconnection, the disclosure herein may substitute ground balls for pins or another types of surface-mount packaging, ball grid arrays, or other conductive interconnections.

In certain embodiments, the non-linear conductive routing may be one of a variety of different shapes. For example, a "zigzag" shape may be utilized for a certain embodiment of non-linear conductive routing. In another example, a "spiral" shape may be utilized for another embodiment of non-linear conductive routing. The spiral shape may include a plurality of adjacent sections of conductive routing where current flows substantially (e.g., "substantially" being within 20%) parallel (e.g., within 20% of parallel between the adjacent sections or within 18 degrees of parallel) relative to the current flow of the adjacent section. Such a configuration may result in or increase mutual inductance that increases the isolation between interconnected ground balls.

In various portions of the disclosure, reference may be made to components that are "connected" or "coupled." "Connected" and "coupled" may refer to two elements being directly connected (e.g., where a portion of one element directly touches that of another element) or being indirectly connected (e.g., where two elements are interconnected by one or more other elements). In certain examples, two elements that are "connected" by a third element may refer to the two elements being directly linked by the third element (e.g., no intervening elements). Two elements that are "coupled" by a third element may refer to two elements that are linked by the third element, but may or may not include additional elements in additional to the third element, in between the two elements. It is appreciated that, for the purposes of the description herein, elements that are "coupled" are also considered to be "connected."

FIG. 1 illustrates a top view of an example of a ball grid array, configured in accordance with some embodiments. FIG. 1 includes system 100 that includes substrate 102 and integrated circuit 104. Integrated circuit 104 includes a ball grid array. The ball grid array may include solder balls 106A and 106B, as well as other solder balls. Substrate 102 may include one or a plurality of layers and one or more of the layers may include electrical circuitry (and/or electrical routing) for communication of electrical signals.

The solder balls (e.g., solder balls 106A and 106B) of the ball grid array may include ground balls as well as other types of solder balls. The solder balls of the ball grid array may be any type of electrical interconnection between components of a system (e.g., between portions of integrated circuit 104 and circuitry of substrate 102). It is appreciated that the systems and techniques described herein may be utilized by any component with electrical connections, including other processing components, memory components, and/or other such components. In various embodiments, the ball grid array may be configured to communicate electrical signals. Such electrical signals may include processing, power, and/or other such signals.

Solder balls 106A and 106B may be electrically coupled. That is, solder balls 106A and 106B may be connected by an electrical connection (e.g., by electrical circuitry). The electrical connection may be a wired, printed circuit, and/or another type of electrical circuit that may electrically couple solder balls 106A and 106B.

Figure 2A:
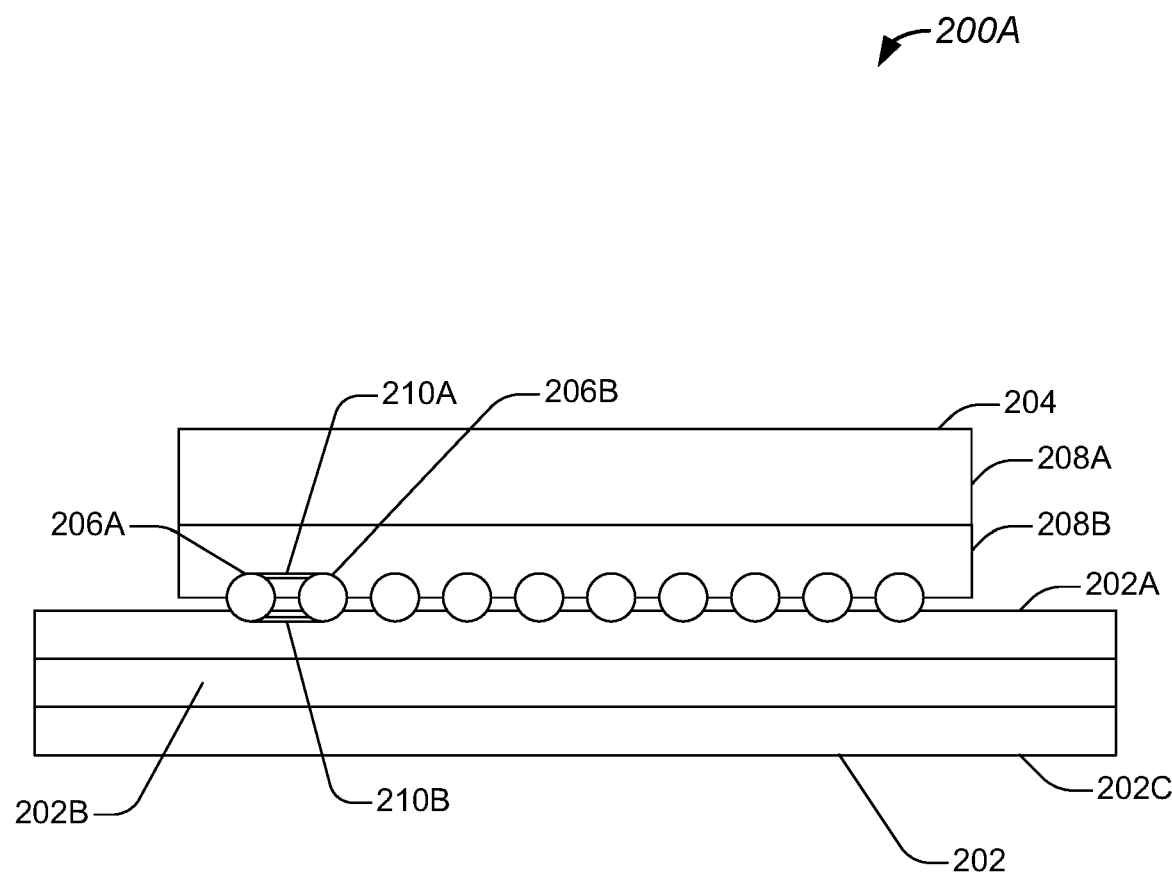
FIG. 2A illustrates a side view of another example of a ball grid array, configured in accordance with some embodiments.

FIG. 2A illustrates a side view of another example of a ball grid array, configured in accordance with some embodiments. FIG. 2A illustrates system 200A that includes printed circuit board (PCB) 202 and integrated circuit 204. PCB 202 includes a plurality of layers, such as layers 202A, 202B, and 202C. One or more layers of PCB 202 may include electrical circuitry. Such circuitry may be configured to communicate electrical signals, as described herein.

Integrated circuit 204 may be a processing device and/or another such device. Integrated circuit 204 may include package substrate layers 208A and 208B. Package substrate layers 208A and 208B may be portions and/or components of integrated circuit 204. In the embodiment of FIG. 2A, solder balls 206A and 206B are coupled to package substrate layer 208B.

Solder balls 206A and 206B may be electrically coupled via conductive routing 210A and/or 210B. In various embodiments, solder balls 206A and 206B may be connected with one or both of conductive routing 210A and 210B. As shown in FIG. 2A, conductive routing 210A is disposed within package substrate layer 208B and electrically couples solder balls 206A and 206B. Additional or alternative to conductive routing 210A, conductive routing 210B is disposed within layer 202A of PCB 202. Thus, certain embodiments may include one or both of conductive routing 210A and 210B. Other embodiments may dispose conductive routing in other layers of the substrate and/or PCB and/or a plurality of layers of the substrate and/or PCB. Thus, for example, other embodiments may dispose conductive routing in one or more of layers 202A, 202B, and 202C, package substrate layers 208A and 208B, and/or other layers of integrated circuit 204 and/or PCB 202 not illustrated in FIG. 2A. In various embodiments, solder balls 206A and 206B may be deposited, printed, and/or other otherwise coupled to PCB 202 and/or to integrated circuit 204.

The solder balls may provide electrical connections for integrated circuit 204 to provide electrical signals to circuitry within integrated circuit 204 and/or PCB 202. In certain embodiments, integrated circuit 204 may include the solder balls (e.g., integrated circuit 204 may be manufactured to include solder balls 206A and 206B, before integrated circuit 204 is coupled to PCB 202). In other embodiments, the solder balls may be disposed on PCB 202 and integrated circuit 204 may be coupled to the solder balls (e.g., electrically connected to portions of integrated circuit 204 during the manufacturing process). In yet other embodiments, solder balls may both be components of integrated circuit 204 and manufactured as a portion of PCB 202. The solder balls of each of integrated circuit 204 and PCB 202 may then be electrically connected during the manufacturing process.

In various embodiments, the entirety of PCB 202 and/or integrated circuit 204 as well as, alternatively or additionally, individual layers thereof, such as package substrate layers 208A and/or 208B and/or layers 202A, 202B, and/or 202C, may be individually and/or collectively referred to as substrates. Such substrates may include solder balls and/or electrically conductive routing coupled to or disposed within the substrates.

Figure 2B:
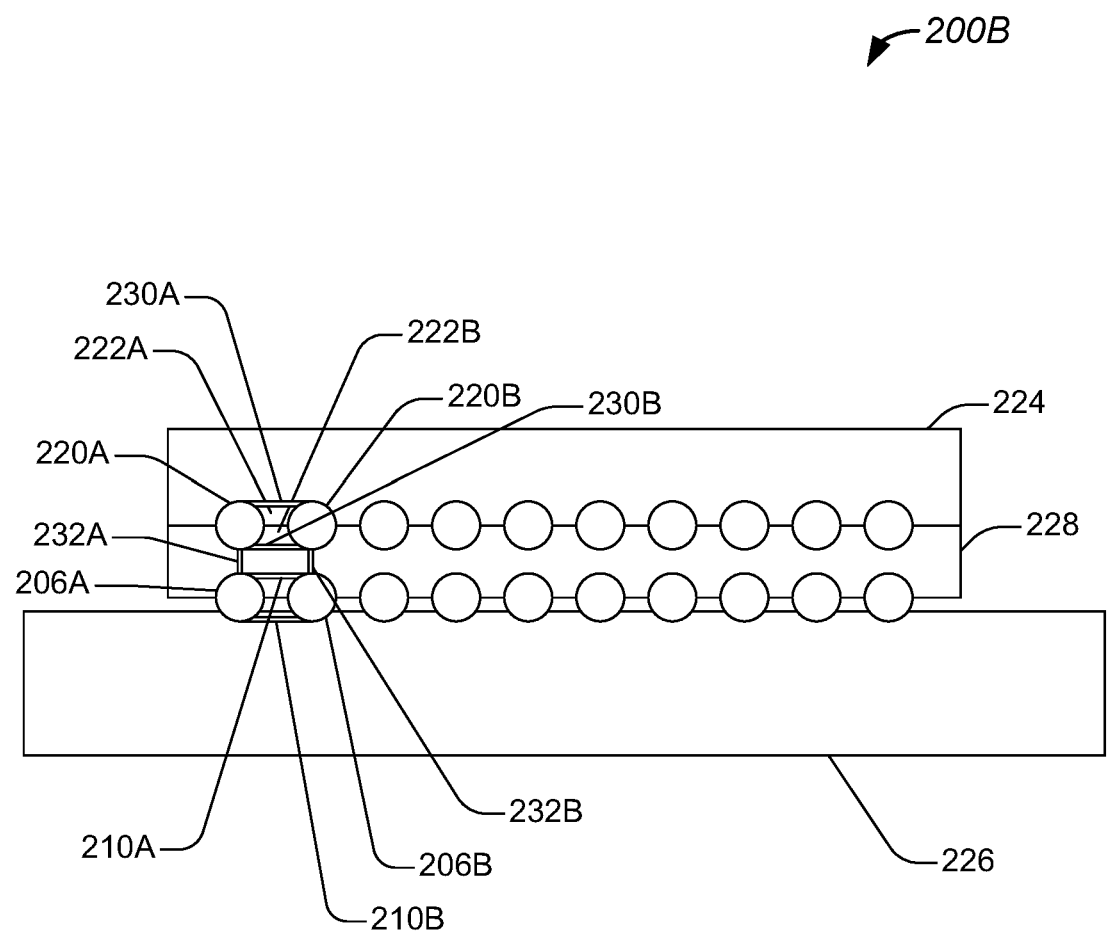
FIG. 2B illustrates a side view of a further example of a ball grid array, configured in accordance with some embodiments.

FIG. 2B illustrates a side view of a further example of a ball grid array, configured in accordance with some embodiments. FIG. 2B illustrates system 200B that includes first substrate 226, second substrate 228, and chip 224. A ball grid array that includes solder balls 206A and 206B may be coupled to first substrate 226 and second substrate 228. A ball grid array that includes solder balls 220A and 220B may be coupled to second substrate 228 and chip 224.

In various embodiments, first substrate 226 and/or second substrate 228 may be a PCB, a substrate of an integrated circuit, an integrated circuit itself, or another such component. Chip 224 may be a processing chip, an integrated circuit, or a portion thereof. In various embodiments, chip 224 may be coupled to or disposed within a portion of second substrate 228.

Solder balls 206A and 206B in FIG. 2B may be coupled to first substrate 226 and second substrate 228. Furthermore, in FIG. 2B, the ball grid array that includes solder balls 220A and 220B may be coupled to second substrate 228 and chip 224. In various embodiments, solder balls 220A and 220B may be electrically coupled via conductive routing disposed within portion 222A and/or portion 222B (e.g., conducting routings 230A and/or 230B). Portions 222A and 222B may be portions of second substrate 228, chip 224, one or more other substrates, and/or another component disposed between second substrate 228 and chip 224. Conductive routings 230A and 230B may be non-linear conductive routing, as described herein. Accordingly, such an embodiment may include ball grid arrays (e.g., with solder balls 220A and 220B) that are disposed within a package and at least a plurality of the solder balls of the ball grid array (e.g., solder balls 220A and 220B) may be electrically coupled with non-linear conductive routing (e.g., non-linear conductive routing disposed within portions 222A and/or 222B), as described herein.

In a further embodiment, solder balls 206A and 220A may be electrically coupled via, for example, conductive routing 232A. Additionally or alternatively, solder balls 206B and 220B may be electrically coupled via conductive routing 232B. Conductive routings 232A and 232B may be non-linear conductive routing, as described herein. In certain such embodiments, conductive routing 232A and/or conductive routing 232B may be disposed within one or more substrates or layers thereof, PCBs, chips, and/or other portions of system 200B, as appropriate.

Figure 3:
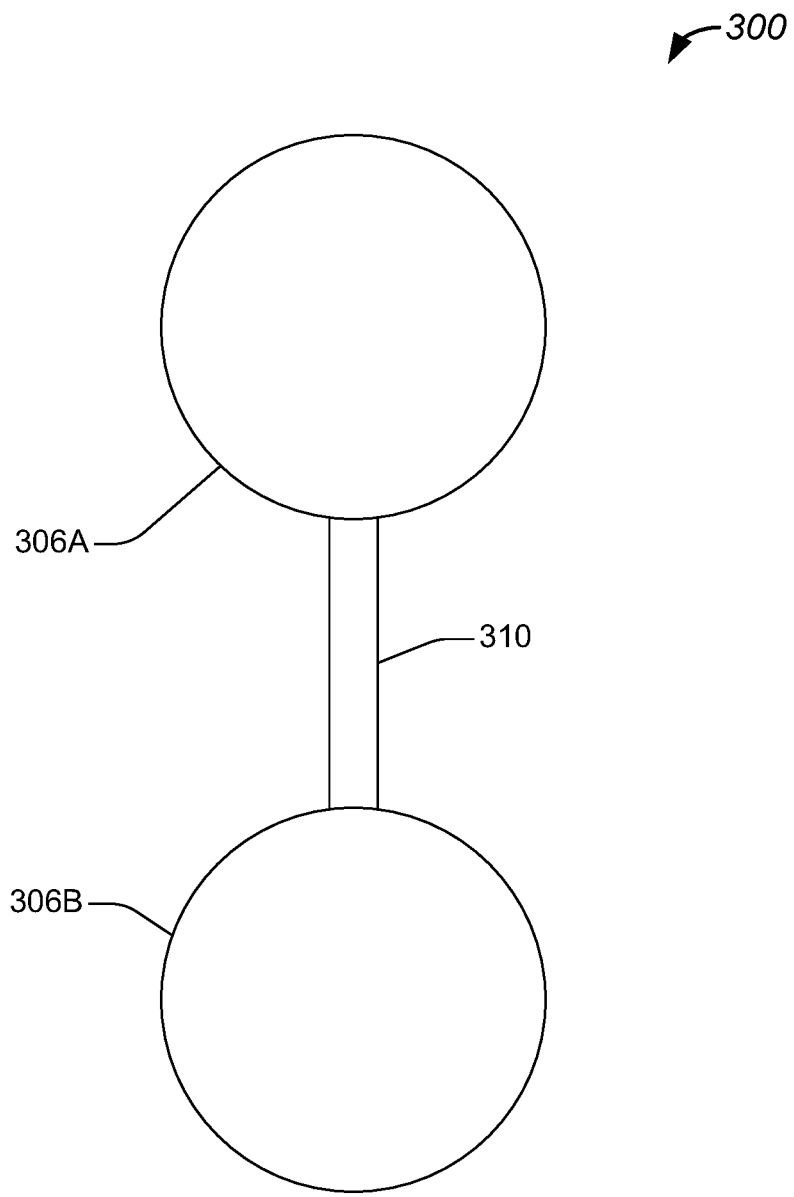
FIG. 3 illustrates an example of ground balls connected by conductive routing, configured in accordance with some embodiments.

FIG. 3 illustrates an example of ground balls connected by conductive routing, configured in accordance with some embodiments. FIG. 3 is an example of a conventional ball grid array with interconnected solder balls. Ball grid array 300 of FIG. 3 includes solder balls 306A and 306B and conductive routing 310. In various embodiments, conductive routing 310 may be disposed within, for example, a chip or a PCB. Conductive routing 310 may electrically couple solder balls 306A and 306B. Solder balls 306A and 306B may be electrically coupled due to regulations and/or design requirements. However, such coupling of ground balls results in poor ball to ball isolation at various frequencies, resulting in signal coupling and poor isolation between solder balls 306A and 306B.

Figure 4:
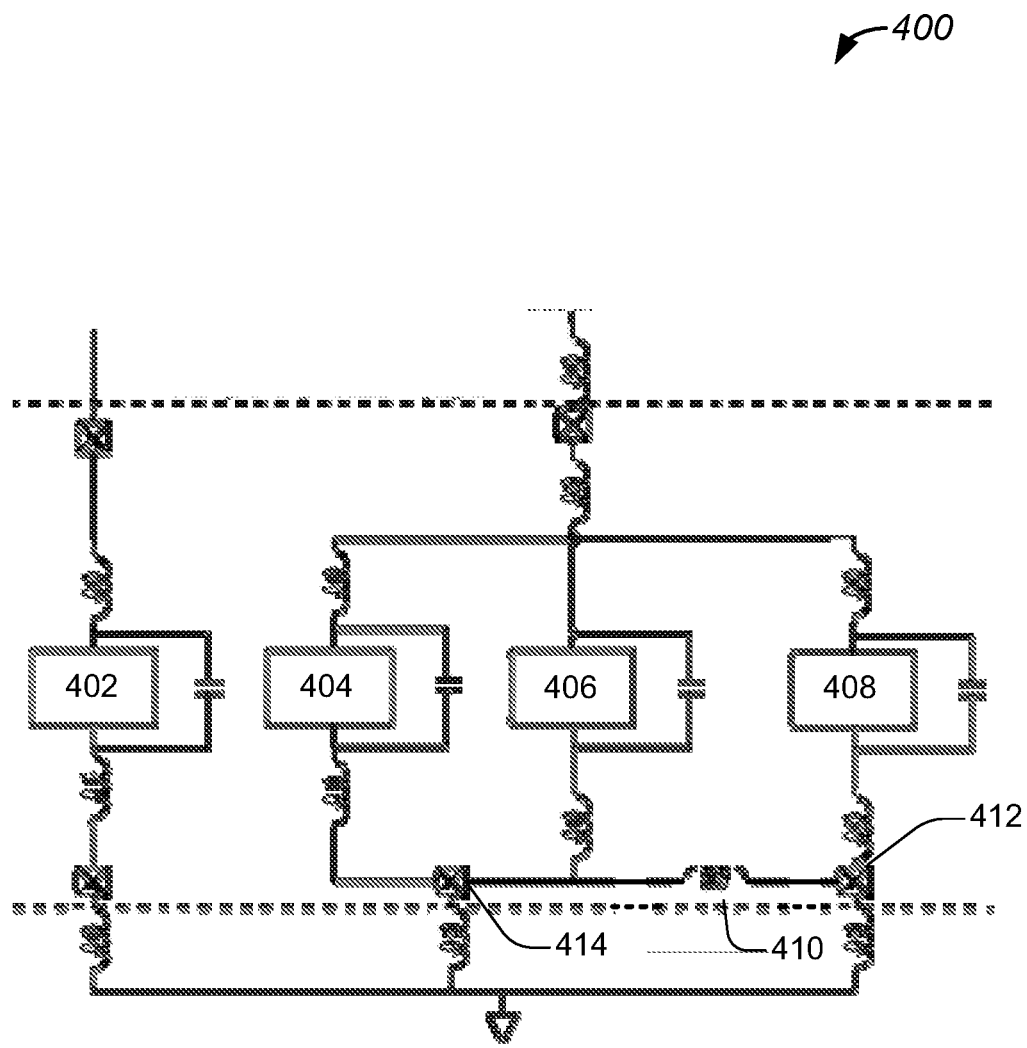
FIG. 4 illustrates an example of ground ball couplings, configured in accordance with some embodiments.

FIG. 4 illustrates an example of ground ball couplings, configured in accordance with some embodiments. FIG. 4 illustrates circuit diagram 400 that includes circuit blocks 402-408. In the example of FIG. 4, at least circuit blocks 406 and 408 are electrically coupled (e.g., via solder balls 412 and 414). In FIG. 4, the electrical coupling of solder balls 412 and 414 may result in inductive coupling 410. Inductive coupling 410 may result in a feedback loop at certain frequencies, resulting in poor isolation and instability.

Figure 5:
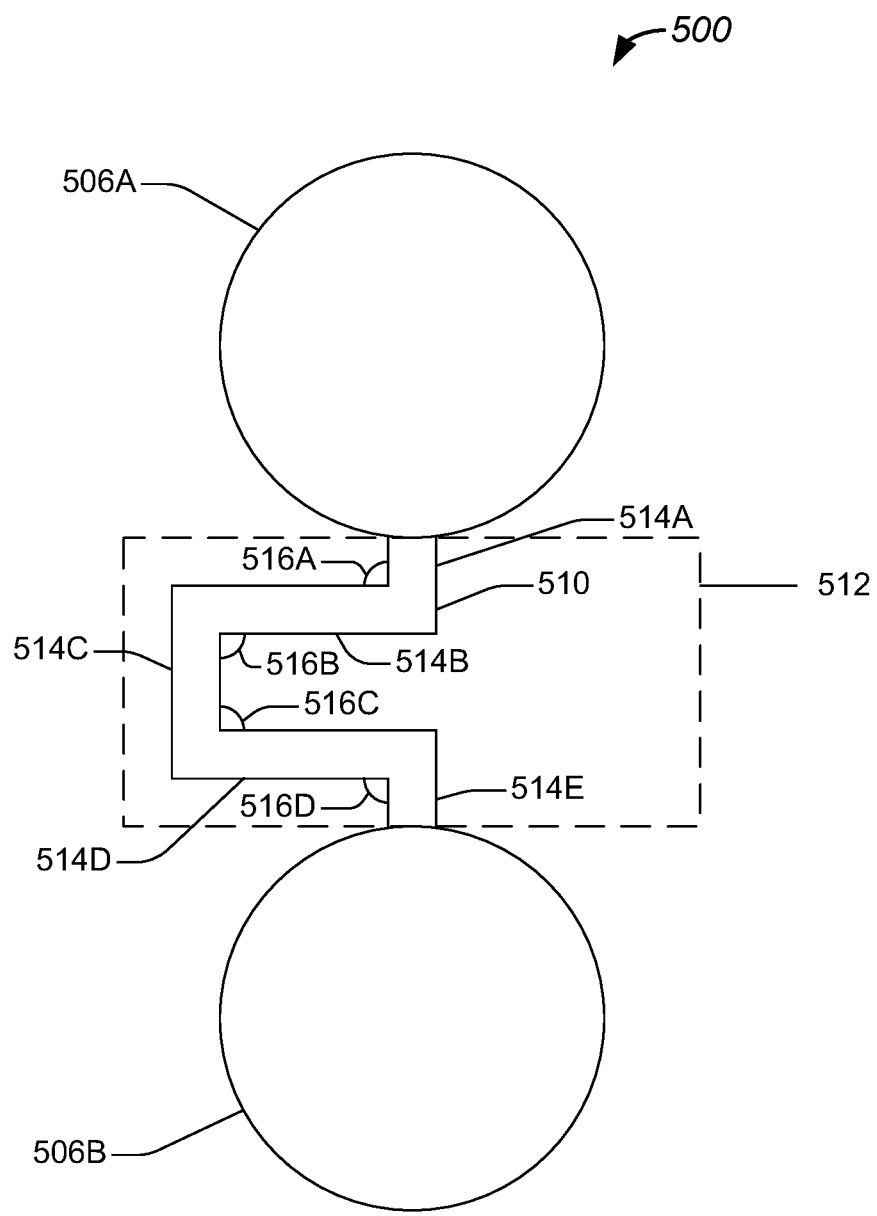
FIG. 5 illustrates an example of ground balls electrically coupled by a non-linear conductive routing, configured in accordance with some embodiments.

FIG. 5 illustrates an example of ground balls electrically coupled by a non-linear conductive routing, configured in accordance with some embodiments. FIG. 5 illustrates ball grid array 500. Ball grid array 500 includes solder balls 506A and 506B separated by area 512. Area 512 may be an area separating solder balls 506A and 506B. Solder balls 506A and 506B may be separated by at least a portion of area 512. In certain embodiments, area 512 may be narrower, the same width, or wider than the diameter and/or width of solder balls 506A and/or 506B. Area 512 may include one or more layers of substrates (e.g., portions of an integrated circuit and/or chip substrates or portions of a PCB) separating solder balls 506A and 506B.

Solder balls 506A and 506B are electrically coupled via non-linear conductive routing 510. Non-linear conductive routing 510 is an embodiment of a zigzag style non-linear conductive routing. At least a portion of non-linear conductive routing 510 may be disposed within area 512. Non-linear conductive routing 510 may include a plurality of portions, where each portion is disposed at an angle to one or more adjacent portions. Thus, for example, non-linear conductive routing 510 may include first routing section 514A, second routing section 514E, third routing section 514B, fourth routing section 514C, and fifth routing section 514D.

Thus, in the example of FIG. 5, each of first routing section 514A, second routing section 514E, third routing section 514B, fourth routing section 514C, and fifth routing section 514D may be disposed at an angle to adjacent sections. Thus, first routing section 514A is connected to and disposed at first angle 516A to third routing section 514B. Third routing section 514B is connected to and disposed at second angle 516B to fourth routing section 514C. Fourth routing section 514C is connected to and disposed at third angle 516C to fifth routing section 514D. Fifth routing section 514D is connected to and disposed at fourth angle 516D to second routing section 514E. Each of angles 516A-D may be acute angles, right angles, or obtuse angles. In certain such embodiments, angles 516A-D may be angles that are in multiples of, for example, 45 degrees, 30 degrees, and/or other such angles. In other embodiments, angles 516A-D may be other angles, such as a gradual curve.

In certain embodiments, routing sections 514A-E may be distinct routing sections. That is, angles, corners, and/or turns within non-linear conductive routing 510 may separate various routing sections. In other embodiments, non-linear conductive routings may include continuously angled sections that do not have distinct linear sections. Such embodiments are also described herein.

Non-linear conductive routing 510 may increase the effective distance of the electrically conductive routing that electrically couples solder balls 506A and 506B. The increase in effective distance of the electrically conductive routing may increase isolation between solder balls 506A and 506B therefore reducing the feedback. Electrical signal coupling may be accordingly reduced and, thus, circuit performance improved. Accordingly, the performance of integrated circuits that are associated with solder balls 506A and 506B (e.g., that utilize solder balls 506A and 506B) may be improved. Though the embodiment of non-linear conductive routing 510 includes five distinct sections, it is appreciated that, in other embodiments, the number of distinct sections may be less than, equal to, or greater than the number of distinct sections of non-linear conductive routing 510.

Figure 6:
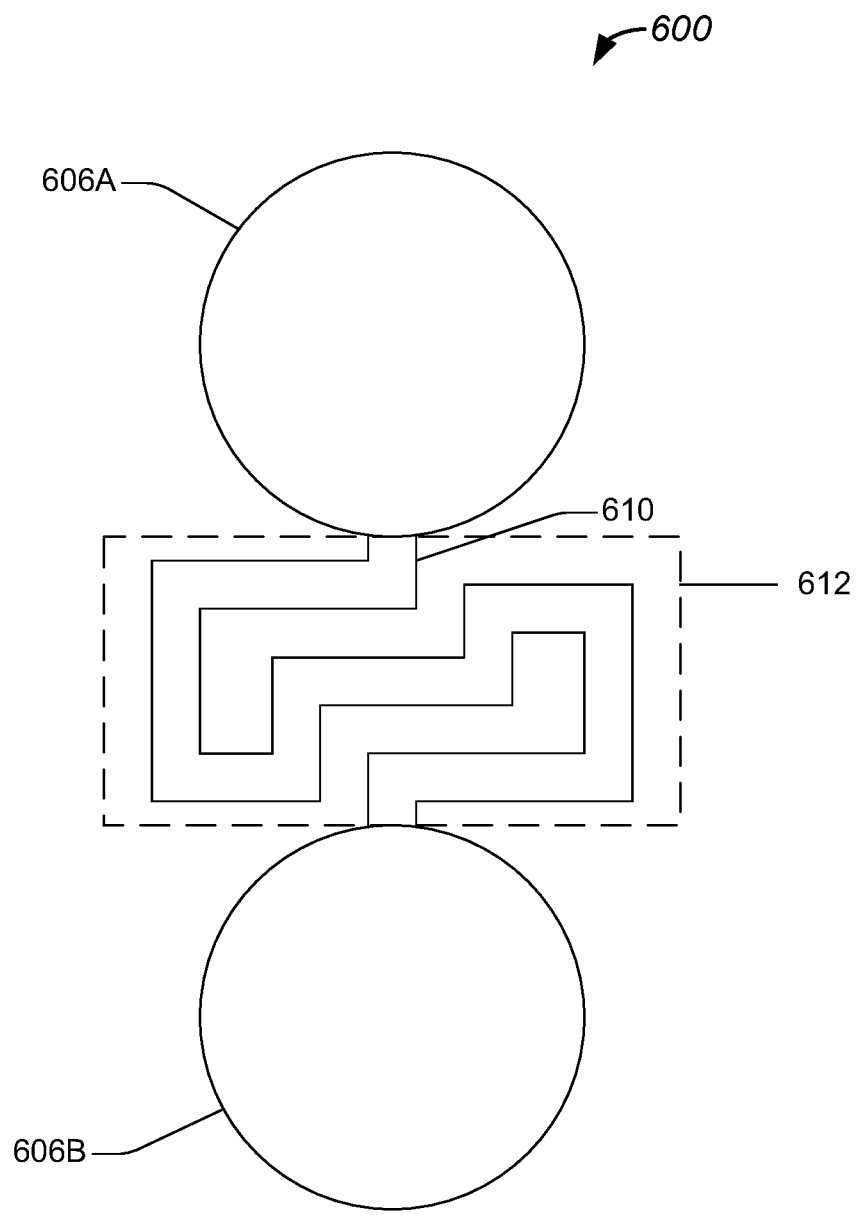
FIG. 6 illustrates another example of ground balls electrically coupled by a non-linear conductive routing, configured in accordance with some embodiments.

FIG. 6 illustrates another example of ground balls electrically coupled by a non-linear conductive routing, configured in accordance with some embodiments. FIG. 6 illustrates ball grid array 600. Ball grid array 600 includes solder balls 606A and 606B separated by area 612. Solder balls 606A and 606B are electrically coupled via non-linear conductive routing 610. Non-linear conductive routing 610 is another embodiment of a zigzag style non-linear conductive routing. In various embodiments, solder balls 606A and 606B may be similar to solder balls 506A and 506B.

For the embodiment of ball grid array 600, non-linear conductive routing 610 may include a plurality of distinct sections. Each section of non-linear conductive routing 610 may be disposed at an angle relative to adjacent sections. At least a portion of non-linear conductive routing 610 may be disposed within area 612. Area 612 may be similar to area 512 of FIG. 5. In certain embodiments, non-linear conductive routing 610 may be configured to utilize a large portion of area 612 or may be configured to be the longest length possible within area 612, in order to increase isolation between solder balls 606A and 606B.

Figure 7:
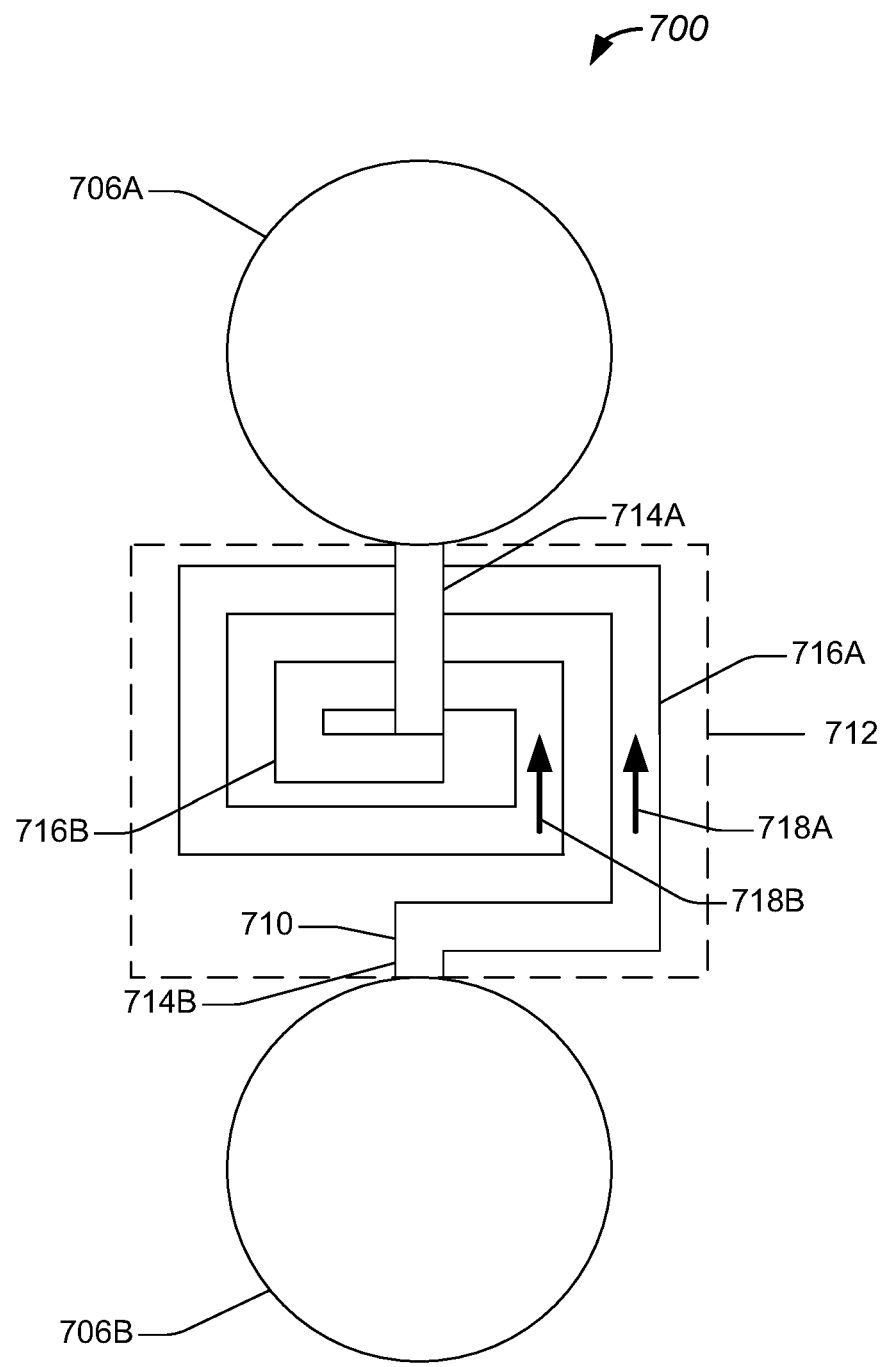
FIG. 7 illustrates a further example of ground balls electrically coupled by a non-linear conductive routing, configured in accordance with some embodiments.

FIG. 7 illustrates a further example of ground balls electrically coupled by a non-linear conductive routing, configured in accordance with some embodiments. FIG. 7 illustrates ball grid array 700 that includes solder balls 706A and 706B. Solder balls 706A and 706B are separated by area 712. Non-linear conductive routing 710 electrically couples solder balls 706A and 706B and at least a portion of non-linear conductive routing 710 may be disposed within area 712. Non-linear conductive routing 710 may be an embodiment of a spiral style non-linear conductive routing. Though zigzag and spiral styles of non-linear conductive routing are illustrated separately, it is appreciated that other embodiments may include both zigzag and spiral style non-linear conductive routing in the same embodiment.

Non-linear conductive routing 710 includes first routing section 714A and second routing section 714B, each electrically coupled to solder ball 706A and solder ball 706B, respectively. Non-linear conductive routing 710 further includes rotational routing sections 716A and 716B.

Rotational routing sections 716A and 716B may be substantially spiral shaped (e.g., may rotate in a clockwise or counterclockwise direction). In the embodiment of non-linear conductive routing 710, rotational routing sections 716A and 716B may include a plurality of distinct sections that each rotate in counterclockwise directions 718A and 718B. Other embodiments may rotate clockwise and/or include sections that rotate in both clockwise and counterclockwise directions.

Rotational routing sections 716A and 716B may each include sections that are disposed adjacent to each other. Such adjacent sections may each flow current in substantially the same general vector direction (e.g., within +/−2, 5, 10, 20 degrees of the same direction) in portions of the sections that are adjacent to each other. The adjacent sections may be disposed close enough to each other that the current flow in substantially the same general vector direction (e.g., in counterclockwise directions 718A and 718B) of such sections may generate or increase mutual inductance between, for example, rotational routing sections 716A and 716B. Such mutual inductance may further increase the isolation provided by non-linear conductive routing 710 between solder balls 706A and 706B.

In various embodiments, first routing section 714A and second routing section 714B may be disposed within different layers of the substrate of the integrated circuit, chip, and/or PCB. Disposing of first routing section 714A and second routing section 714B within different layers of the substrate may be due to the rotational routing sections circling back on itself, thus requiring one or more portions of non-linear conductive routing 710 to be disposed within a different layer to avoid electrical routing from contacting portions of itself that should not be in contact. In certain embodiments, one or more of the rotational routing sections may be disposed within the same layer of the substrate as one of first routing section 714A or second routing section 714B. In other embodiments, one or more of the rotational routing sections may be disposed within a layer of the substrate different from both of that of first routing section 714A and second routing section 714B.

Figure 8:
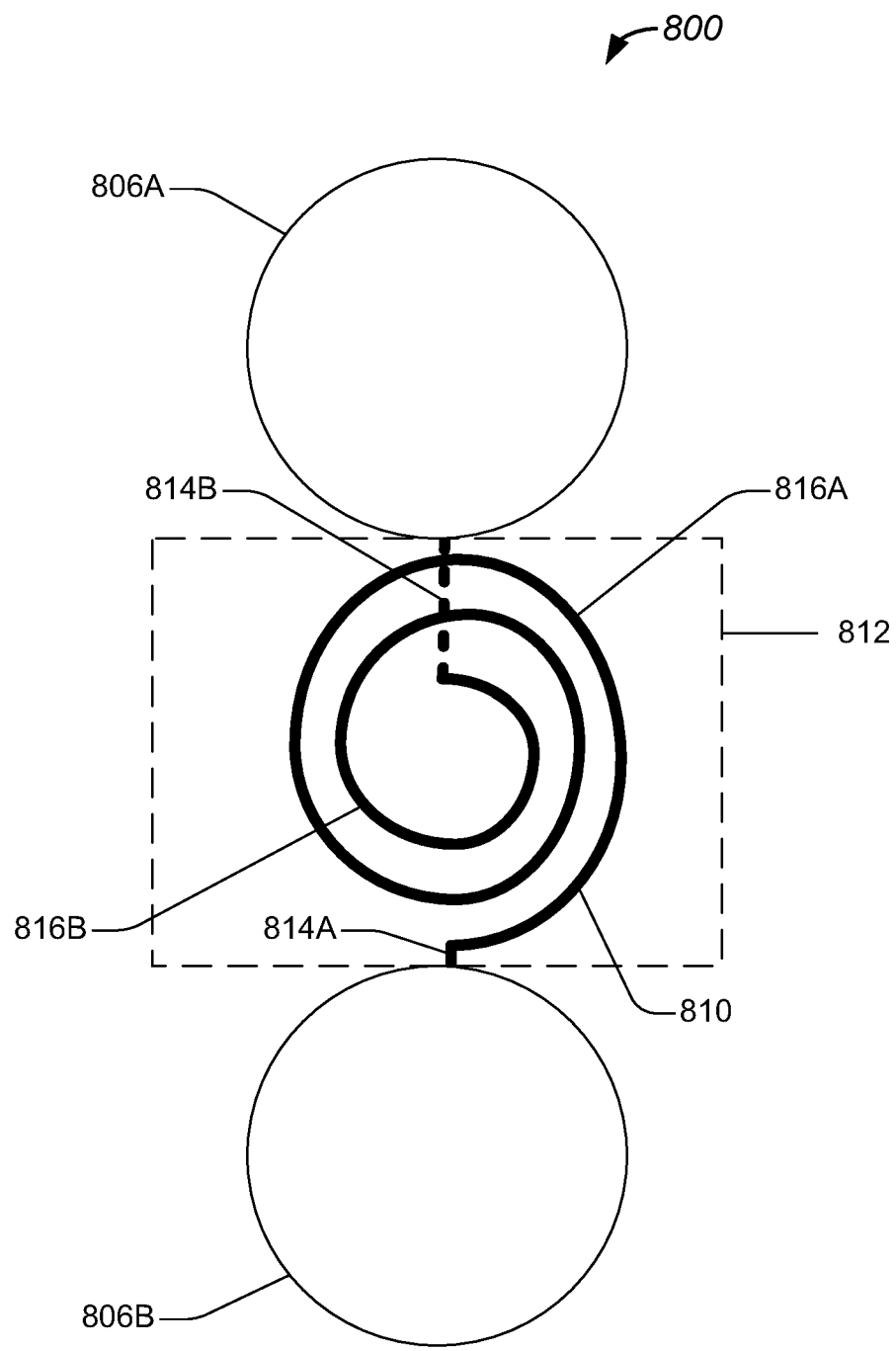
FIG. 8 illustrates yet another example of ground balls electrically coupled by a non-linear conductive routing, configured in accordance with some embodiments.

FIG. 8 illustrates yet another example of ground balls electrically coupled by a non-linear conductive routing, configured in accordance with some embodiments. FIG. 8 illustrates ball grid array 800 that includes solder balls 806A and 806B separated by area 812. Non-linear conductive routing 810 electrically couples solder balls 806A and 806B and at least a portion of non-linear conductive routing 810 may be disposed within area 812. Non-linear conductive routing 810 may be another embodiment of a spiral style non-linear conductive routing.

Non-linear conductive routing 810 includes first routing section 814A and second routing section 814B. Each of first routing section 814A and second routing section 814B are electrically coupled to solder ball 806A and solder ball 806B, respectively. In certain embodiments, first routing section 814A and second routing section 814B may be disposed on different layers of the substrate. Non-linear conductive routing 810 further includes rotational routing sections 816A and 816B. Rotational routing sections 816A and 816B may be continuously curved. As such, each of rotational routing sections 816A and 816B may be substantially circular shaped.

Rotational routing sections 816A and 816B may each include sections that are disposed relative to one another, where the current flowing in each portion of adjacent sections are in substantially the same general vector direction. Though rotational routing sections 816A and 816B are both curved, each may include substantially similar changes in angle along each adjacent portion of rotational routing sections 816A and 816B, respectively. Such a configuration may generate or increase mutual inductance, increasing isolation between solder balls 806A and 806B.

Figure 9:
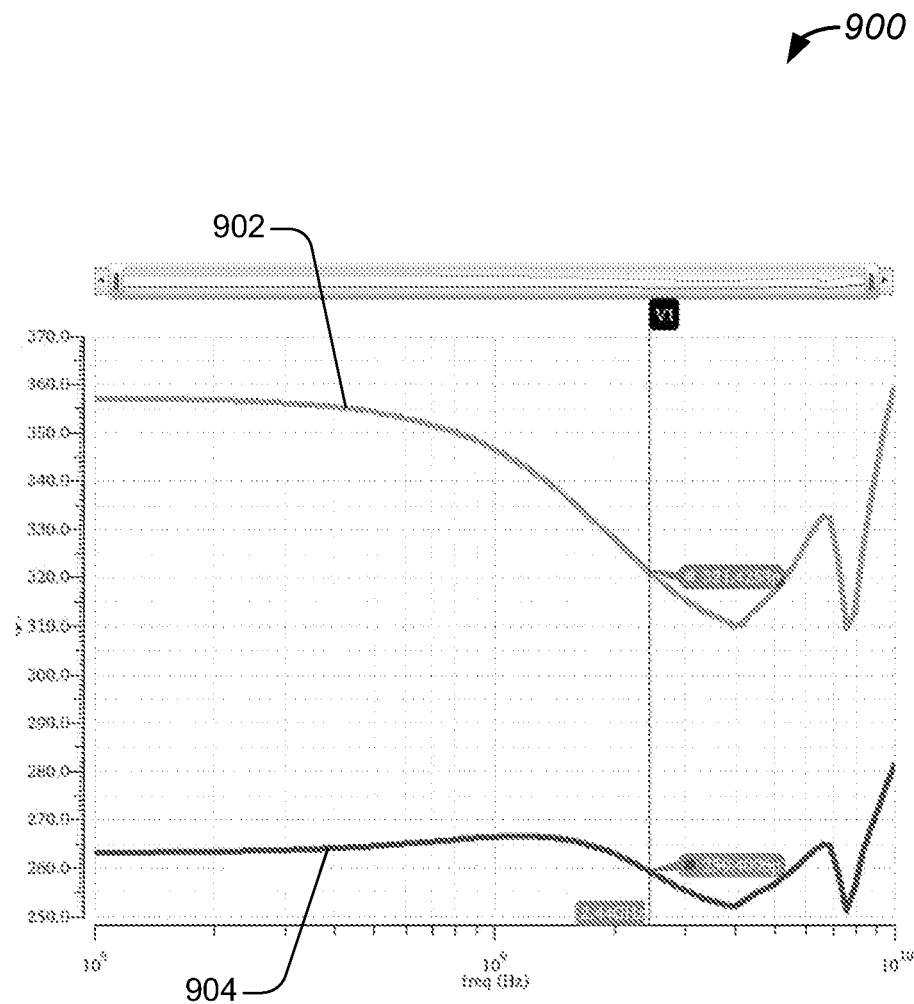
FIG. 9 illustrates a simulation result indicating the increase in isolation due to non-linear conductive routing.

FIG. 9 illustrates a simulation result indicating the increase in isolation due to non-linear conductive routing. FIG. 9 illustrates plot 900 showing simulation results of inductance between two solder balls. Plot 900 illustrates the inductance of a conventionally electrically connected solder balls in line 904 and that of solder balls electrically coupled by a zigzag shaped non-linear conductive routing in line 902. Plot 900 illustrates that the simulation results indicate that inductance between the solder balls increases by approximately 20 percent when the zigzag shaped non-linear conductive routing is utilized in place of conventional electrical connections. In embodiments utilizing a spiral non-linear conductive routing, inductance may increase by an even greater amount compared to conventionally electrically coupled solder balls.

Figure 10:
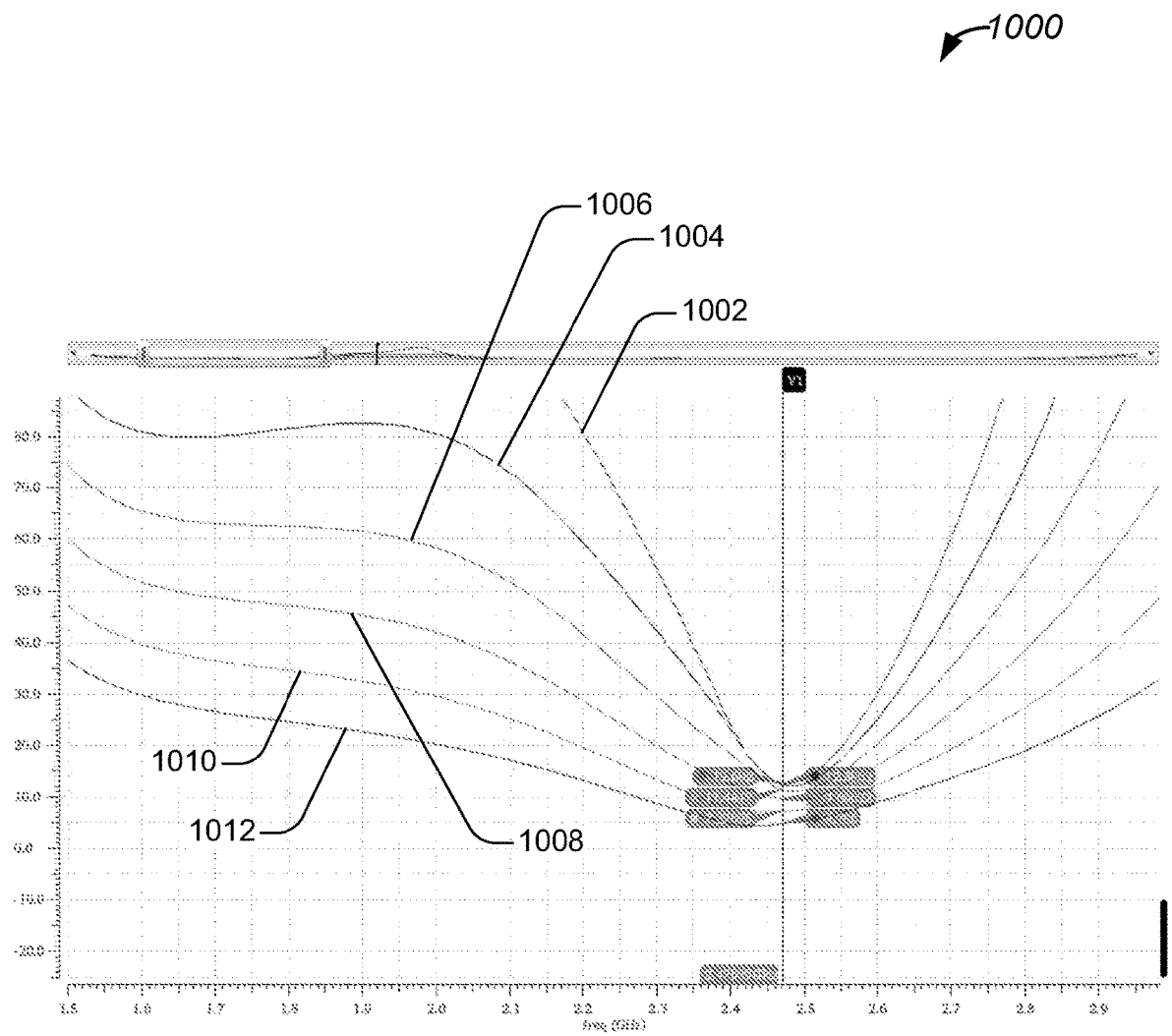
FIG. 10 illustrates another simulation result indicating the increase in isolation due to non-linear conductive routing.

FIG. 10 illustrates another simulation result indicating the increase in isolation due to non-linear conductive routing. FIG. 10 illustrates plot 1000 showing simulations results of system k factors for given inductance values. Thus, lines 1002, 1004, 1006, 1008, 1010, and 1012 correspond to various inductance values (e.g., various picohenry values). As shown in plot 1000, as inductance values increase, the k factor for the system also increases and, thus, the system stability also increases.

Figure 11:
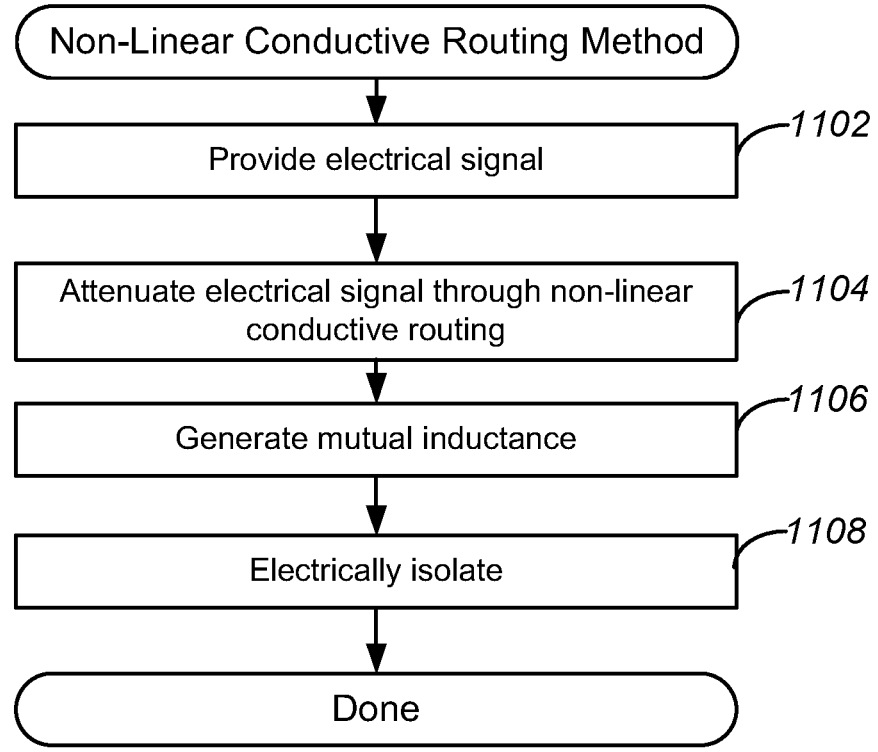
FIG. 11 illustrates a flow chart of an example of utilizing non-linear conductive routing, implemented in accordance with some embodiments.

FIG. 11 illustrates a flow chart of an example of utilizing non-linear conductive routing, implemented in accordance with some embodiments. FIG. 11 illustrates a technique for utilizing the non-linear conductive routing to increase isolation between two or more electrically connected solder balls in a ball grid array.

In 1102, an electrical signal is provided or received by a first solder ball within the ball grid array. The first solder ball may be electrically coupled to a second solder ball. The solder balls may be electrically coupled by non-linear conductive routing, in a configuration similar to that described herein. The non-linear conductive routing may be in a zigzag, spiral, or other configuration that may lengthen the effective distance of the non-linear conductive routing and/or generate mutual inductance, in order to isolate the solder balls.

In 1104, based on the electrical signal being provided or received, the non-linear conductive routing may increase isolation between the solder balls and, thus, attenuate the electrical signal. The increased isolation results from the greater effective distance of the non-linear conductive routing, as compared to conventionally electrically coupled solder balls.

In optional 1106, for embodiments where the non-linear conductive routing is of a spiral shape, mutual inductance may be generated (e.g., based on the spiral shape). The mutual inductance may be generated due to, for example, current flow in substantially similar vector directions in corresponding sections of the non-linear conductive routing. Such corresponding sections may, for example, be substantially parallel to each other. Mutual inductance may further increase the isolation between the solder balls.

In 1108, based on the increased effective distance of the non-linear conductive routing and/or the mutual inductance (generated in spiral shaped embodiments of the non-linear conductive routing), electrical isolation between the solder balls may be increased. The increased electrical isolation may improve the performance of the solder balls and the ball grid array.

Figure 12:
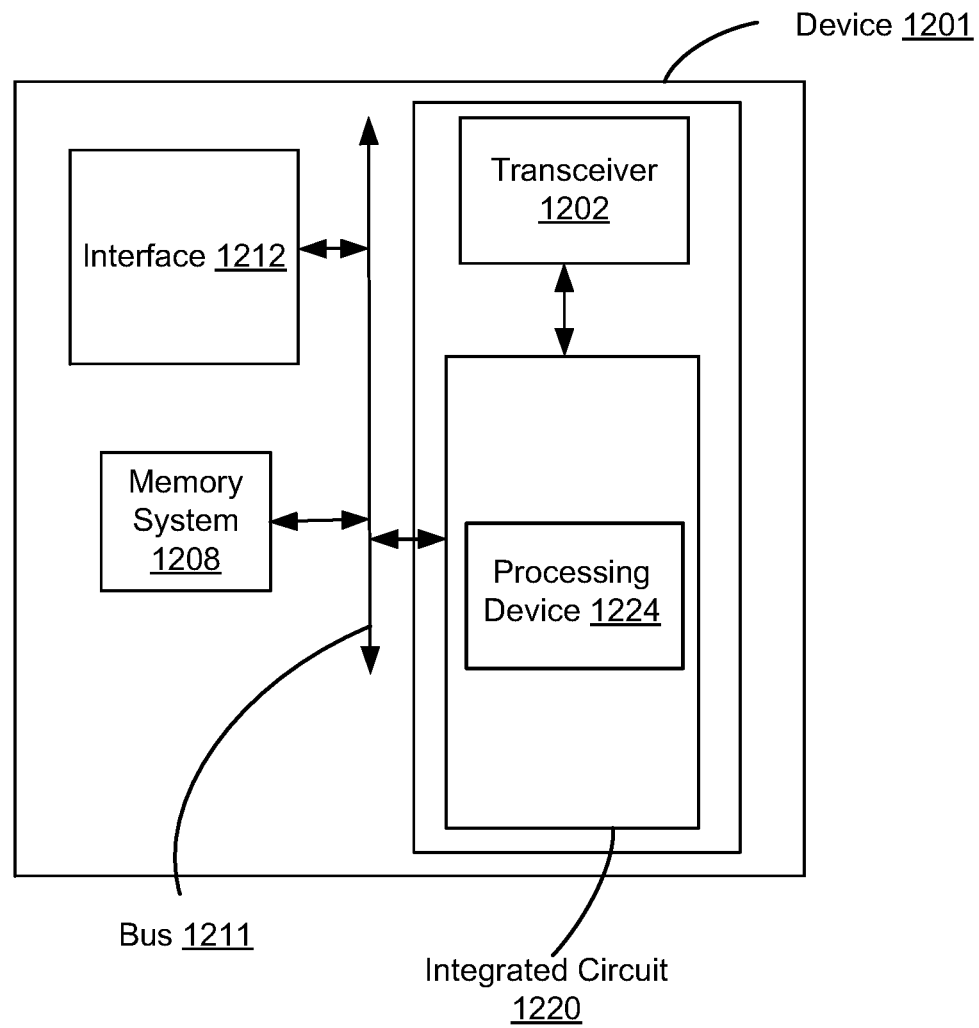
FIG. 12 illustrates an example device, configured in accordance with some embodiments.

FIG. 12 illustrates an example device, configured in accordance with some embodiments. FIG. 12 illustrates an example device 1201 that may include components that utilize non-linear conductive routing. Though device 1201 may be one such example of a device utilizing non-linear conductive routing, it is appreciated that other embodiments may utilize non-linear conductive routing in other devices as non-linear conductive routing may be utilized for any device or integrated circuit that includes ball grid arrays, such as any device that includes a processor.

FIG. 12 illustrates device 1201 that includes a transceiver 1202, interface 1212, memory system 1208, bus 1211, and integrated circuit 1220. Integrated circuit 1220 may include processing device 1224 which may include logic implemented using one or more processor cores. Accordingly, processing device 1224 includes one or more processing devices that are configured to implement timing and/or perform operations (e.g., based on instructions provided by memory system 1208). In certain embodiments, processing device 1224 may include components described herein, such as the ball grid arrays described herein. In various embodiments, processing device 1224 may include one or multiple processor cores which are each configured to implement specific portions of instructions. Examples of integrated circuit 1220 include analog, digital, and mixed signal integrated circuits. For example, integrated circuit 1220 may be a microprocessor, digital signal processor, microcontroller, programmable logic device such as a field-programmable gate array, and/or another type of integrated circuit.

Memory system 1208 may be configured to store one or more instructions that may be implemented by processing device 1224 (e.g., communicated via bus 1211). Accordingly, memory system 1208 may be a storage device, which may include transitory or non-transitory memory. Memory system 1208 may be any type of memory system, such as solid state memory, hard drives, and/or other such systems. Memory system 1208 may be configured to communicate instructions and/or data to processing device 1224 for use in processing operations.

In certain embodiments, transceiver 1202 may be configured to transmit and receive signals using a communications medium such as an antenna. Thus, transceiver 1202 may be configured to communicate in one or more communications mediums, such as Bluetooth, WiFi, and/or other communications mediums. Transceiver 1202 may be accordingly included within one or more communication components or devices.

Interface 1212 may be a user interface, communication interface, power interface, and/or another type of interface that allows for device 1201 to interact with external systems. Thus, for example, interface 1212 may be a communication interface configured to send and receive data packets over a network. Examples of supported interfaces include, but are not limited to: Ethernet, fast Ethernet, Gigabit Ethernet, frame relay, cable, digital subscriber line (DSL), token ring, Asynchronous Transfer Mode (ATM), High-Speed Serial Interface (HSSI), and Fiber Distributed Data Interface (FDDI).

Interface 1212 may, additionally or alternatively, be a power interface configured to receive power from one or more sources. As such, interface 1212 may include amplifiers, inverters, and/or other components that are utilized to power device 1201 or components thereof. Interface 1212 may, additionally or alternatively, include a power supply and device 1201 may include power management circuitry (e.g., within a PCB of device 1201).

In a further embodiment, interface 1212 may include a user interface that receives touch, audio, remote, and/or other interactions from a user and, based on the interaction, device 1201 performs operations accordingly. Such an interface 1212 may additionally provide outputs, to communicate information to a user. The outputs may be, for example, haptic feedback, audio, visual, and/or other such outputs. Interface 1212 may include ports and/or plugs appropriate for interaction with external systems. Interface 1212 may also include an independent processor and/or volatile RAM. A computer system or computing device may include or communicate with a monitor, printer, or other suitable display for providing any of the results mentioned herein to a user.

In certain embodiments of device 1201, one, some, or all of the components of FIG. 12 may not be included and/or may be implemented with other components. Furthermore, certain embodiments of device 1201 may include additional components not described herein. It is appreciated that such additional components may be utilized in systems with the systems and techniques described herein.

It will be appreciated that one or more of the above-described components may be implemented on a single chip, or on different chips. For example, transceiver 1202 and/or processing device 1224 may be implemented on the same integrated circuit chip, such as integrated circuit chip 1220. In another example, transceiver 1202 and/or processing device 1224 may be implemented as a multi-chip module or on a common substrate such as a printed circuit board (PCB).

Although the foregoing concepts have been described in some detail for purposes of clarity of understanding, it will be apparent that certain changes and modifications may be practiced within the scope of the appended claims. It should be noted that there are many alternative ways of implementing the processes, systems, and devices. Accordingly, the present examples are to be considered as illustrative and not restrictive.

What is claimed is:

1. A system comprising:
a printed circuit board; and
a microprocessor, comprising a ball grid array and a substrate, coupled on the printed circuit board, and wherein:
the ball grid array comprises;
a first solder ball;
a second solder ball; and
the substrate comprises a non-linear conductive routing electrically coupling the first solder ball and the second solder ball, the non-linear conductive routing comprising, at least:
a first routing section connected to the first solder ball;
a second routing section connected to the second solder ball and non-linearly coupled to the first routing section, wherein the first solder ball and the second solder ball are separated by at least a portion of a first area, and wherein the non-linear conductive routing is non-linearly disposed within the first area;
a third routing section connected to the first routing section; and
a fourth routing section connected to the third routing section, disposed within the third routing section, and coupled to the second routing section, wherein each of the third routing section and the fourth routing section are rotational routing sections configured to flow current in a first rotational direction.

2. The ball grid array of claim 1, wherein the non-linear conductive routing comprises at least four changes of routing a direction.

3. The ball grid array of claim 1, wherein at least a first portion of the third routing section is substantially parallel to a second portion of the fourth routing section.

4. The ball grid array of claim 3, wherein the third routing section comprises a third rotational first section, a third rotational second section, a third rotational third section, and a third rotational fourth section, wherein the fourth rotational routing section comprises a fourth rotational first section, a fourth rotational second section, a fourth rotational third section, and a fourth rotational fourth section.

5. The ball grid array of claim 4, wherein the third rotational first section is parallel to the fourth rotational first section, the third rotational second section is parallel to the fourth rotational second section, the third rotational third section is parallel to the fourth rotational third section, and the third rotational fourth section is parallel to the fourth rotational fourth section.

6. The ball grid array of claim 1, wherein the non-linear conductive routing is configured to increase mutual inductance between the third routing section and the fourth routing section.

7. The ball grid array of claim 1, wherein the first solder ball and the second solder ball are separated by a first linear distance, and wherein the non-linear conductive routing comprises a second distance greater than the first linear distance.

8. A ball grid array comprising;
a first solder ball;
a second solder ball; and
a non-linear conductive routing electrically coupling the first solder ball and the second solder ball and comprising, at least:
  a first routing section connected to the first solder ball;
  a second routing section connected to the second solder ball and non-linearly coupled to the first routing section, wherein the first solder ball and the second solder ball are separated by at least a portion of a first area, and wherein the non-linear conductive routing is non-linearly disposed within the first area;
  a third routing section connected to the first routing section; and
  a fourth routing section connected to the third routing section, disposed within the third routing section, and coupled to the second routing section, wherein each of the third routing section and the fourth routing section are rotational routing sections configured to flow current in a first rotational direction.

9. The ball grid array of claim 8, wherein the non-linear conductive routing comprises at least four changes of routing a direction.

10. The ball grid array of claim 8, wherein the non-linear conductive routing is a portion of a substrate.

11. The ball grid array of claim 10, wherein the substrate comprises a first layer and a second layer, and wherein the substrate is a portion of a microprocessor.

12. The ball grid array of claim 11, wherein all of the non-linear conductive routing is disposed within the first layer.

13. The ball grid array of claim 8, wherein at least a first portion of the third routing section is substantially parallel to a second portion of the fourth routing section.

14. The ball grid array of claim 13, wherein the third routing section comprises a third rotational first section, a third rotational second section, a third rotational third section, and a third rotational fourth section, wherein the fourth rotational routing section comprises a fourth rotational first section, a fourth rotational second section, a fourth rotational third section, and a fourth rotational fourth section.

15. The ball grid array of claim 14, wherein the third rotational first section is parallel to the fourth rotational first section, the third rotational second section is parallel to the fourth rotational second section, the third rotational third section is parallel to the fourth rotational third section, and the third rotational fourth section is parallel to the fourth rotational fourth section.

16. The ball grid array of claim 8, wherein the non-linear conductive routing is configured to increase mutual inductance between the third routing section and the fourth routing section.

17. The ball grid array of claim 8, wherein the first solder ball and the second solder ball are separated by a first linear distance, and wherein the non-linear conductive routing comprises a second distance greater than the first linear distance.

18. A method comprising;
communicating an electrical signal with a first solder ball, wherein the first solder ball is electrically coupled, via a non-linear conductive routing, with a second solder ball, wherein the first solder ball and the second solder ball are separated by at least a portion of a first area, wherein the non-linear conductive routing comprises a plurality of rotational routing sections, each rotational routing section configured to flow current in a first rotational direction, and wherein the non-linear conductive routing is non-linearly disposed within the first area; and
generating, based on a shape of the non-linear conductive routing, a mutual inductance to electromagnetically isolate the first solder ball and the second solder ball.

19. The method of claim 18, wherein the non-linear conductive routing comprises a first routing section, a second routing section, a third routing section, and a fourth routing section; and
wherein the third routing section comprises a third rotational first section, a third rotational second section, a third rotational third section, and a third rotational fourth section, wherein the fourth rotational routing section comprises a fourth rotational first section, a fourth rotational second section, a fourth rotational third section, and a fourth rotational fourth section.

20. The method of claim 19, wherein the third rotational first section is parallel to the fourth rotational first section, the third rotational second section is parallel to the fourth rotational second section, the third rotational third section is parallel to the fourth rotational third section, and the third rotational fourth section is parallel to the fourth rotational fourth section.

* * * * *